United States Patent
Jain et al.

(10) Patent No.: US 10,481,202 B2
(45) Date of Patent: Nov. 19, 2019

(54) IN-FIELD SELF-TEST CONTROLLER FOR SAFETY CRITICAL AUTOMOTIVE USE CASES

(71) Applicant: QUALCOMM Incorporated, San Diego, CA (US)

(72) Inventors: Arvind Jain, Bangalore (IN); Nishi Bhushan Singh, Bangalore (IN); Rahul Gulati, San Diego, CA (US); Pranjal Bhuyan, San Diego, CA (US); Rakesh Kumar Kinger, San Diego, CA (US); Roberto Averbuj, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 119 days.

(21) Appl. No.: 15/835,227

(22) Filed: Dec. 7, 2017

(65) Prior Publication Data

US 2018/0231609 A1 Aug. 16, 2018

Related U.S. Application Data

(60) Provisional application No. 62/458,534, filed on Feb. 13, 2017.

(51) Int. Cl.
*G01R 31/317* (2006.01)
*G01R 31/3187* (2006.01)
(Continued)

(52) U.S. Cl.
CPC ... *G01R 31/31724* (2013.01); *G01R 31/3183* (2013.01); *G01R 31/3187* (2013.01);
(Continued)

(58) Field of Classification Search
CPC .......... G01R 31/31724; G01R 31/3183; G01R 31/31921; G01R 31/318547;
(Continued)

(56) References Cited

U.S. PATENT DOCUMENTS 6,249,893 B1   6/2001  Rajsuman et al.
7,917,820 B1 * 3/2011  Pavle ............ G01R 31/318597
                                                          714/718

(Continued)

OTHER PUBLICATIONS

A. Dutta, M. Shah, G. Swathi and R. A. Parekhji, "Design techniques and tradeoffs in implementing non-destructive field test using logic BIST self-test," 2009 15th IEEE International On-Line Testing Symposium, Sesimbra, Lisbon, 2009, pp. 237-242.*

(Continued)

*Primary Examiner* — Cynthia Britt
(74) *Attorney, Agent, or Firm* — Arent Fox, LLP

(57) ABSTRACT

A self-test controller includes a memory configured to store a test patterns, configuration registers, and a memory data component. The test patterns are encoded in the memory using various techniques in order to save storage space. By using the configuration parameters, the memory data component is configured to decode the test patterns and perform multiple built-in self-test on a multitude of test cores. The described techniques allow for built-in self-test to be performed dynamically while utilizing less space in the memory.

27 Claims, 9 Drawing Sheets

(51) Int. Cl.
  *G01R 31/319*      (2006.01)
  *G01R 31/3183*     (2006.01)
  *G01R 31/3185*     (2006.01)
  *G06F 9/448*       (2018.01)

(52) U.S. Cl.
  CPC .......... *G01R 31/31921* (2013.01); *G01R 31/318547* (2013.01); *G06F 9/4498* (2018.02)

(58) Field of Classification Search
  CPC ..... G01R 31/3187; G06F 11/27; G06F 11/36; G06F 9/4498; G11C 29/36; G11C 29/10; G11C 2029/3602
  See application file for complete search history.

(56) References Cited

U.S. PATENT DOCUMENTS

| | | | |
|---|---|---|---|
| 9,612,930 | B2 | 4/2017 | Shanbhogue et al. |
| 2010/0127729 | A1 | 5/2010 | Zjajo et al. |
| 2010/0325481 | A1 | 12/2010 | Dahan et al. |
| 2012/0036341 | A1 | 2/2012 | Morfey et al. |
| 2012/0191388 | A1 | 7/2012 | Parle |
| 2015/0039950 | A1 | 2/2015 | Monroe et al. |
| 2015/0067310 | A1* | 3/2015 | Henry ............... G06F 1/3237 713/1 |
| 2015/0187440 | A1 | 7/2015 | Hollis et al. |
| 2016/0146888 | A1 | 5/2016 | Vooka et al. |
| 2019/0162782 | A1* | 5/2019 | Shanbhogue ...... G01R 31/3187 |

OTHER PUBLICATIONS

Y. Zorian, E. J. Marinissen and S. Dey, "Testing embedded-core based system chips," Proceedings International Test Conference 1998 (IEEE Cat. No. 98CH36270), Washington, DC, USA, 1998, pp. 130-143.*

D. Bhattacharya, "Hierarchical test access architecture for embedded cores in an integrated circuit," Proceedings. 16th IEEE VLSI Test Symposium (Cat. No. 98TB100231), Monterey, CA, USA, 1998, pp. 8-14.*

B. Nadeau-Dostie, S. M. I. Adham and R. Abbott, "Improved Core Isolation and Access for Hierarchical Embedded Test," in IEEE Design & Test of Computers, vol. 26, No. 1, pp. 18-25, Jan.-Feb. 2009.*

International Search Report and Written Opinion—PCT/US2018/015578—ISA/EPO—dated May 3, 2018.

* cited by examiner

| Valid | Op. Code | Future Use | Future Use | Repeat Opcode [0:5] | TDI_VALUE | TMS_VALUE | TRSTN_VALUE | TCK_EN_VALUE | TDO_MASK | TDO_CMP_VALUE |
|---|---|---|---|---|---|---|---|---|---|---|
| 0 | 1 | 2 | 3 | [4:9] | 10 | 11 | 12 | 13 | 14 | 15 |

| Valid | Data_Type | | | Full Length | Valid Data Length | | | | Data |
|---|---|---|---|---|---|---|---|---|---|
| 0 | 1 | 2 | 3 | 4 | 5 | 6 | 7 | 8 | [63:9] |

| OPCODE Mapping | |
|---|---|
| 000 | No Data |
| 001 | TDI |
| 010 | TMS |
| 011 | TRSTN |
| 100 | TCK_EN |
| 101 | TDO_MASK |
| 110 | TDO_COMP |

500

| Valid | Data_Type | | | Data_Type | | | Data_Type |
|---|---|---|---|---|---|---|---|
| 0 | 1 | 2 | 3 | 4 | 5 | 6 | 7 | [63:8] |

| OPCODE Mapping | |
|---|---|
| 000 | NOP |
| 001 | Load IR (TDO data) |
| 010 | Load DR (TDI Data) |
| 011 | Load_DR_APPEND (TDI Data) |
| 100 | Capture_DR (TDO_MASK_DATA) |
| 101 | Capture_DR (TDO_COMP_DATA) |

IN-FIELD SELF-TEST CONTROLLER FOR SAFETY CRITICAL AUTOMOTIVE USE CASES

CROSS-REFERENCE TO RELATED APPLICATION(S)

This application claims the benefit of U.S. Provisional Application Ser. No. 62/458,534, entitled "In-Field Self-Test Controller for Safety Critical Automotive Cases" and filed on Feb. 13, 2017 which is expressly incorporated by reference herein in its entirety.

BACKGROUND

Field

The present disclosure relates generally to a self-test controller, and more particularly, to an in-field self-test controller for safety critical automotive use cases.

Background

International Organization for Standardization (ISO) 26262 is an international standard for functional safety of electrical/electronic systems in automobiles. The ISO 26262 defines functional safety for automotive equipment throughout the lifecycle of automotive electronic/electrical systems. One key functional safety requirement is to ensure integrity of the safety-related automotive electronic/electrical systems. The integrity of safety-related automotive electronic/electrical systems may be checked through in-field self-tests. New apparatuses and methods are needed in association with in-field self-tests of safety-related automotive electronic/electrical systems.

SUMMARY

In an aspect of the disclosure, a self-test controller is disclosed. The self-test controller includes a memory configured to store a test pattern that includes test subpatterns such that each of the test subpatterns includes test vectors and the test vectors in each of the test subpatterns correspond to a different test core of a plurality of test cores. The self-test controller also includes configuration registers configured to store configuration parameters that indicate a subset of the plurality of the test cores that are test enabled. Furthermore, the self-test controller also has a memory data component configured to upload the test pattern and decode the test vectors in a subset of the test subpatterns that correspond to the subset of the plurality of the test cores that the configuration parameters indicate are test enabled. In this manner, less storage space is required to store test patterns in the memory as a test pattern does not have to be stored for every combination of test cores that may be enabled and disabled.

In another aspect, a self-test controller is disclosed that includes a memory and a memory data component. The memory is configured to store first test data and a first repetition value. The memory data component is configured to upload the first test data and the first repetition value from the memory and the memory data component is configured to generate a first set of test vectors such that each test vector in the first set of the test vectors includes test data that is a copy of the first test data and a number of the test vectors in the first set of the test vectors corresponds to the first repetition value. In this manner, repetitive test data does not have to be stored repeatedly, thus saving storage space in the memory.

BRIEF DESCRIPTION OF THE DRAWINGS

FIG. 4 illustrates another example of an encoding scheme for a 16-bit test vector that is stored in the ROM of the self-test controller shown in FIGS. 1 and 2.

FIG. 5 illustrates one example of an encoding scheme for a 64-bit test vector that is stored in the ROM of the self-test controller shown in FIGS. 1 and 2.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

ISO 26262 is an international standard for functional safety of electrical/electronic systems in automobiles (road vehicles). One key requirement of ISO 26262 is to ensure that safety-related automotive electronic/electrical system integrity is maintained and is continuing to perform the function for which the system was designed. The integrity of safety-related automotive electronic/electrical systems may be checked through in-field self-tests. The in-field self-tests may detect any structural hardware faults over the life of the silicon and may be performed upon system power up, during runtime in the field, and upon initiation of shutdown. Exemplary methods and apparatuses are provided infra in relation to structural in-field tests of intellectual property (IP) logic test cores and memories. An in-field test may be referred to as in-field logic built in self-test (LBIST) and memory built in self-test (MBIST). Safety critical automotive applications/systems may involve the use of a central processing unit (CPU), digital signal processor (DSP), network processing unit (NPU), dedicated hardware accelerators, etc. Some examples of safety critical automotive applications/systems include instrument cluster display systems, advanced driver assistance systems (ADAS), and surround view systems.

The ability to support a structural field test has been a huge challenge that grows multifold for supporting such tests on pre-closed hard macros without modification to the hard macros. In addition, storage of a large amount of test stimuli on-chip to achieve the required test coverage is a challenge from a die area perspective. Further, there may be a need to run additional on-demand (unplanned) structural test cases in-field for debug or coverage enhancement for higher automotive safety integrity level (ASIL) safety critical use cases. Lastly, there may be a need to run multiple on-demand structural test cases in field for several IPs in parallel. In order to address these issues, an exemplary self-test controller is provided infra with respect to FIGS. 1-9.

Figure 1:
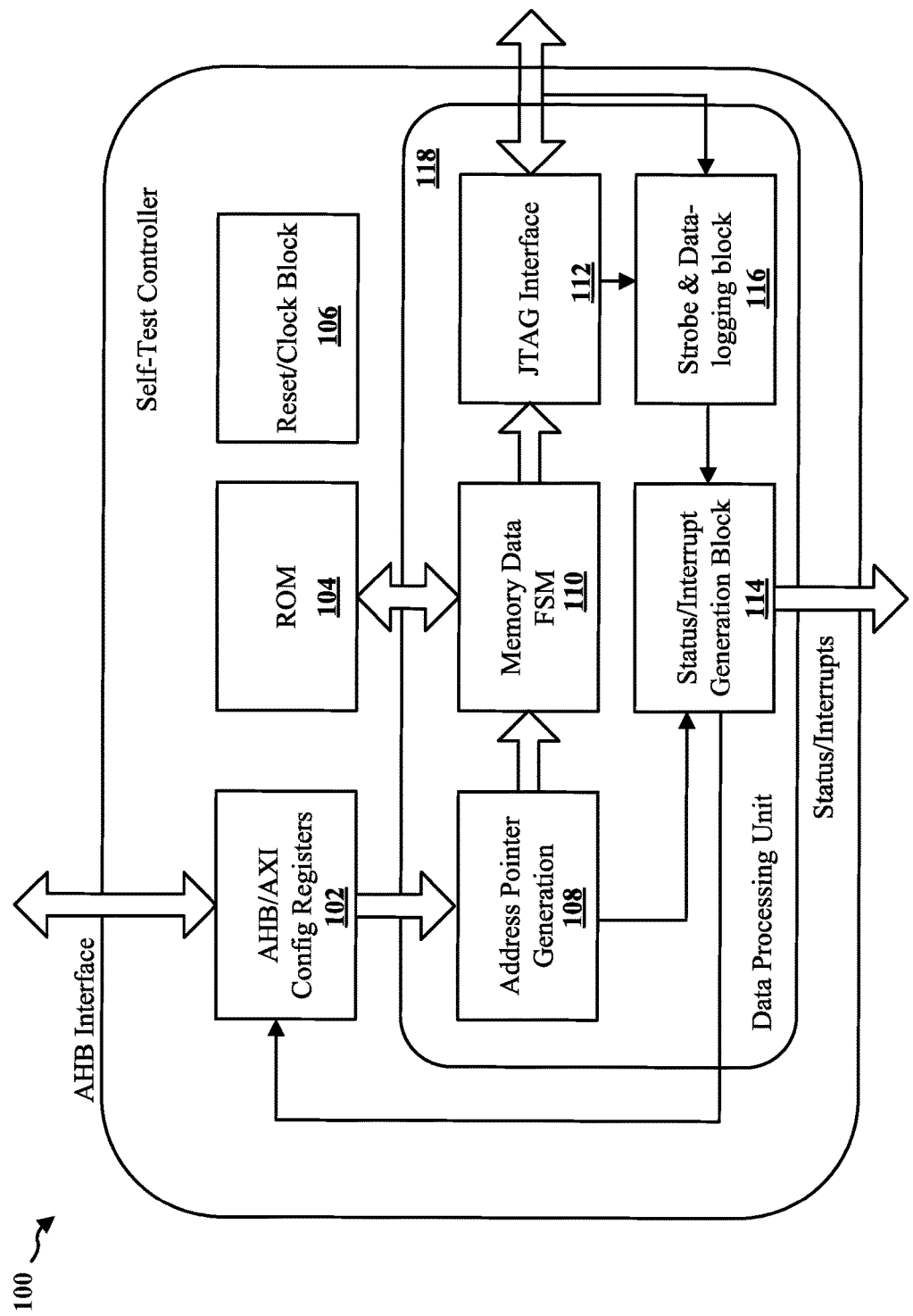
FIG. 1 is a diagram illustrating an exemplary self-test controller.

FIG. 1 is a diagram illustrating an exemplary self-test controller 100. The self-test controller 100 can be viewed as an on-chip hardware abstraction of tester equipment, capable of applying the stimuli and comparing the stimuli results stored on-chip. The self-test controller 100 includes a data processing unit 118, advanced risk machine (ARM) advanced microcontroller bus architecture (AMBA)/advanced extensible interface (AXI) configuration register block 102, a read only memory (ROM) 104, and a reset/clock block 106. The data processing unit 118 includes an address pointer generation block 108, a memory data fine state machine (FSM) 110, a joint test action group (JTAG) interface 112, a status/interrupt generation block 114, and a strobe and data logging block 116.

The memory data FSM 110 is configured to implement a JTAG encoding/decoding scheme that reduces the space in the ROM 104 for the multitude of BISTs that can be implemented through the self-test controller 100. The memory data FSM 110 is configured to provide decoded JTAG vectors to the JTAG interface 112, which implements the decoded JTAG vectors in accordance with JTAG implementation schemes so that the test cores implement the BIST. The ROM 104 is configured to store test patterns that are encoded by the memory data FSM 110 to reduce the space required to implement the multitude of BIST through the coordination of the self-test controller 100.

In one aspect, multiple BIST may be implemented in parallel by the JTAG interface 112. More specifically, a single test pattern may be utilized to implement various BIST simultaneously. In this case, the test pattern may include test subpatterns, where each test subpattern is for a different BIST implemented by a different test core. Accordingly, each of the test subpatterns includes test vectors and the test vectors in each of the test subpatterns correspond to a different test core of a plurality of test cores.

The self-test controller 100 allows for the dynamic selection of BISTs to implement so that any combination of the BISTs may be implemented. Thus, in some aspects, the JTAG interface 112 is configured to implement all of the BIST of a test pattern in parallel, some of the BIST of the test pattern in parallel, or just one of the BIST of the test pattern. However, providing a test pattern for every combination of BIST that may or may not be implemented would consume an excessive amount of storage space in the ROM 104.

Accordingly, in one implementation, the test pattern for multiple BISTs to be implemented in parallel is stored assuming that all of the BISTs are to be implemented. Each of the test vectors of the test pattern thus stores test data for a JTAG vector and a test core identifier that identifies the test core that the test vector is directed to. The configuration register block 102 may include configuration registers configured to store configuration parameters that indicate a subset of the plurality of the test cores that are test enabled.

The memory data FSM 110 is configured to upload the test pattern and decode the test vectors in a subset of the test subpatterns that correspond to the subset of the plurality of the test cores that the configuration parameters indicate are test enabled.

More specifically, the memory data FSM 110 is configured to read the configuration parameters in the configuration register block 102 that indicate which of the test cores is test enabled and which of the test cores is test disabled. As mentioned above, the test pattern for multiple BISTs to be implemented in parallel is stored assuming that all of the BISTs are to be implemented. However, for each of the test vectors in the test pattern, the memory data FSM 110 is configured to read the core identifier of the test vector and determine whether the core identifier identifies one of the test cores that is enabled. In response to the test core identifier of the test vector identifying a test core that is test disabled, the memory data FSM 110 is configured to ignore the test vector of the test pattern. On the other hand, the memory data FSM 110 is configured to decode the test vector and generate a JTAG vector with the test data of the test vector in response to the memory data FSM 110 identifying a test core that is test enabled.

In this manner, even though the test pattern is stored assuming that all of the BISTs are to be implemented, the memory data FSM 110 is configured to generate JTAG vectors for the test vectors that are directed to test enabled test cores. Accordingly, a test pattern does not have to be stored for each combination of possible test cores that may be enabled or disabled. Instead, the test pattern for multiple BISTs to be implemented in parallel is stored assuming that all of the BISTs are to be implemented but the memory data FSM 110 is configured to generate JTAG vectors from the test vectors that are directed to test enabled test cores, as described by the only provided JTAG vectors for the test cores that are test enabled in accordance with the configuration parameters in the configuration register block 102. Accordingly, fewer test patterns are stored in the ROM 104 since test patterns for every combination of test enabled and test disabled test cores do not need to be stored in the ROM 104.

In another aspect, the memory data FSM 110 is configured to generate and store encoded test patterns in the ROM 104 such that repetitive test data does not have to be continually repeated in the ROM 104. More specifically, the ROM 104 is configured to store test data and a repetition value when the test data is repetitive. The memory data FSM 110 is configured to upload the test data and the repetition value from the ROM 104. In this case, the memory data FSM 110 is configured to generate a set of test vectors such that each test vector in the set of the test vectors includes test data that is a copy of the stored test data. The number of the test vectors in the set of the repeated test vectors corresponds to the repetition value that was stored in the ROM 104. The repetition value may indicate that the test data is redundant. Thus, rather than storing repetitions of the same test vector, the repetition value may be used to simply indicate the number of times that the test data is repeated.

In one example, the memory data FSM 110 is configured to receive a first encoded test vector that includes test data where the memory data FSM 110 is configured to decode the first encoded test vector by generating a first JTAG vector with a copy of the test data. Next, the memory data FSM 110 is configured to receive a second encoded test vector that includes a repetition value. The memory data FSM 110 then is configured to generate a plurality of JTAG vectors that are copies of the first JTAG vector. Thus, each of the plurality of JTAG vectors include a copy of the test data from the first encoded test vector. The number of JTAG vectors that include copies of the test data is determined in accordance with the repetition value in the second encoded test vectors.

In another example, the memory data FSM 110 is configured to receive an encoded test vector that includes both test data and a repetition value from the ROM 104. The memory data FSM 110 is configured to decode the encoded test vector by generating a set of JTAG vector, each having a copy of the test data from the encoded test vector. The number of JTAG vectors in the set of JTAG vectors (i.e., the number of repetitions) is based on the repetition value of the encoded test vector. The memory data FSM 110 is then configured to provide the decoded set of repeated JTAG vectors to the JTAG interface 112.

As illustrated, the data processing unit 118 is configured to load and to execute a required test vector from the ROM 104. However, the data processing unit 118 is also configured to load and to execute a required test vector from a quad serial peripheral interface (QSPI) flash memory, a secure digital (SD) card, double data rate (DDR) synchronous dynamic random access memory (SDRAM), and random access memory (RAM). Furthermore, by instantiating an initiator as part of the self-test controller architecture, the self-test controller 100 can issue concurrent JTAG vectors to perform a self-test on multiple IP cores (logic and/or memory) concurrently. Specifically, through software, the self-test controller 100 can configure/control which tests on IP cores (logic and/or memory) run in parallel and which tests on IP cores (logic and/or memory) run in series.

The self-test controller 100 enables storing of encoded test vectors in compressed (coded) format in the self-test ROM 104. The address pointer generation block 108 is configured for dynamic address pointer generation, which enables one or more IP core tests to run in parallel as per fault tolerant time interval (FTTI) requirements. The address pointer generation block 108 is configured to generate a dynamic address pointer, which is received by the memory data FSM 110. The memory data FSM 110 is configured to upload the test vectors indicated by the dynamic address pointer. For example, the memory data FSM 110 may iterate though the test vectors of a test pattern based on the dynamic address pointer. Additionally, the address pointer generation block 108 may generate the dynamic address pointer so that the memory data FSM 110 implements the test vectors of a slice of a test pattern. In one aspect, the slice may be a test subpattern in the test pattern. The address pointer generation block 108 may generate the dynamic address pointer based on software programmable registers in the AHB/AXI configuration register block 102.

The status/interrupt generation block 114 interfaces the self-test controller 100 with other components on the system on a chip (SoC). Specifically, the address pointer generation block 108 may fetch encoded test vectors from the software programming registers in the AHB/AXI configuration register block 102, and may provide one or more vectors to the memory data FSM 110. The memory data FSM 110 may fetch coded/compressed test data from the ROM 104 based on the provided vector(s), and may provide the coded/compressed test data to the JTAG interface 112. The JTAG interface 112 decodes/decompresses the coded test data and applies the decoded/decompressed test data to the IP test cores.

Figure 2:
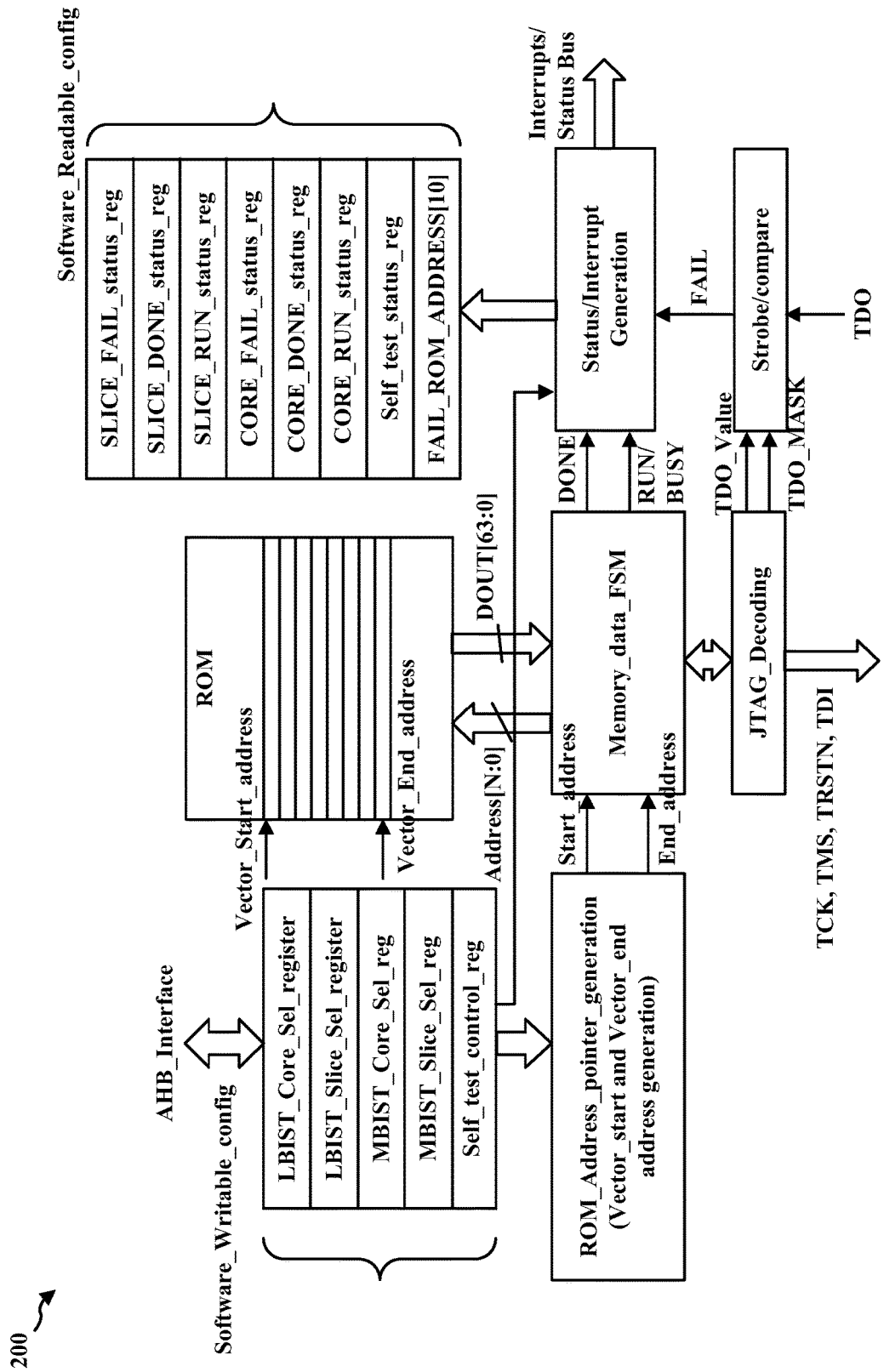
FIG. 2 is a diagram illustrating an exemplary self-test controller dataflow.

FIG. 2 is a diagram illustrating an exemplary self-test controller dataflow 200 of the self-test controller 100 shown in FIG. 1. The ROM 104 has different test patterns stored in an encoded format. For BIST, the memory data FSM 110 is configured to decode the encoded test patterns and generate decoded test patterns formatted in accordance with JTAG interface requirements. Based on software programmed values (e.g., core selection, slice selection, run-time BIST vs power-on BIST) provided as configuration parameters in the AHB/AXI configuration register block 102, the address pointer generation block 108 is configured to generate a start address (i.e., START_ADDRESS in FIG. 2) and an end address (i.e., an END_ADDRESS in FIG. 2) of different test vectors to be applied on the test cores. For example, the AHB/AXI configuration register block 102 may include configuration registers configured to store configuration parameters, such as the total number of cores (M in FIG. 2), total number of slices (N in FIG. 2), a slice length (SLICE_LENGTH in FIG. 2), and a test setup length (TEST_SETUP_LENGTH in FIG. 2). Software may program start and end addresses into configuration registers, which can be read by the address pointer generation block 108.

The memory data FSM 110 is configured to read the configuration parameters in the AHB/AXI configuration register block 102 and generate a start address for a test pattern (or a slice of a test pattern) and an end address for the test pattern (or a slice of a test pattern). The memory data FSM 110 is configured to receive the start address and the end address from the address pointer generation block 108 and upload the test pattern (which may be the entire test pattern or a slice of a larger test pattern) based on the start address and the end address.

The manner that the test vectors in the test pattern are uploaded is also dependent on the encoding of the test vectors in the ROM 104. As shown in FIG. 2, the ROM 104 is configured to output 64-bit data words that are uploaded by the memory data FSM 110. Thus, as the memory data FSM 110 progresses from the start address to the end address of the test pattern, the memory data FSM 110 is configured to upload the test pattern as a sequence of 64 bit data words. In this example, each 64-bit data word include multiple encoded test vectors. More specifically, as explained in further detail below, each encoded test vector is provided by 16 bits. Accordingly, each 64-bit data word includes 4 encoded test vectors. Thus, rather than providing one test vector per 64 bit data word, the test pattern is encoded so that 4 encoded test vectors are provided per 64 bit data word. This thus provides for a more efficient storage configuration for the test patterns. The memory data FSM 110 is configured to decode the 16-bit encoded test vectors as explained in further detail below.

The memory data FSM 110 is configured to decode the 16-bit encoded test vectors so as to generate JTAG vectors from the 16-bit encoded test vectors. Accordingly, a subset of the test subpatterns from the ROM 114 that correspond to the test enabled test cores is decoded so as to generate a JTAG test pattern. The JTAG test pattern includes JTAG subpatterns of JTAG vectors for the BISTs of the different test enabled test cores. The memory data FSM 110 is configured to provide the JTAG test pattern with the JTAG vectors to the JTAG interface 112. In one aspect, the memory data FSM 110 is configured to apply the JTAG pattern to the test enabled test cores through the JTAG interface 112 such that the JTAG subpatterns are implemented in parallel by the subset of the plurality of the test cores, as explained in further detail below. In another aspect, the memory data FSM 110 is configured to apply the JTAG pattern to the test enabled test cores through the JTAG interface 112 such that the JTAG subpatterns are implemented in series by the test enabled test cores, as explained in further detail below.

As shown in FIG. 2, the JTAG interface 112 is configured to apply the sequence of JTAG vectors in the JTAG pattern and apply them to the test cores in accordance with JTAG testing specifications. For example, the JTAG interface 112 may be configured to generate a Test Data In (TDI), Test Reset (TRSTN), Test Mode Select (TMS), and a Test Clock (TCLK) signals from the JTAG vectors provided by the memory data FSM 110. These signals may be generated in accordance to the test data from the JTAG vectors and sequenced to perform BISTs by the JTAG interface 112 to the appropriate test cores.

The strobe and data logging block 116 is configured to receive Test Data Output (TDO), which indicates the results of the BISTs from the test cores. Furthermore, the JTAG interface 112 may be configured to generate a TDO Value (which indicates the expected results of the BIST if there were no errors) and a TDO Mask (which is used when comparing TDO and TDO Value when TDO Values are represented in hexadecimal) to the strobe and data logging block 116. The strobe and data logging block 116 is configured to compare with the TDO Values from the test data in the JTAG vectors with the TDO resulting from the BISTs implemented by the test cores. The strobe and data logging block 116 may include simple comparison logic that implements these comparisons to continuously monitor the strobes and asserts dynamic fail and sticky fail signals and thus monitor a pass/fail status for the BISTs. The strobe and data logging block 116 may also implement counter-based monitoring to determine failed BIST and report 10 failures with failing addresses (e.g., FAIL_ROM_ADDRESS[10]) in the AHB/AXI configuration register block 102 corresponding to test subpatterns from the ROM 104 that have failed.

The strobe and data logging block 116 is configured to provide the dynamic fail and sticky fail signals to the status/interrupt generation block 114. Furthermore, the memory data FSM 110 is configured to provide done signals and run/busy signals to the status/interrupt generation block 114. This status/interrupt generation block 114 is configured to generate different status and interrupt signals that are monitored and used to write to status registers in the AHB/AXI configuration register block 102, as shown in FIG. 2. For example, different status signals can be checked through configuration register mapping. This block will also take care of abort functionality of self-test controller 100 which is based on a particular software programmable bit that may abort running the BIST and reset all Juelich Digital Readout Systems (JDRs) and running test cores. This may return the test cores as a Device Under Test (DUT) for further operations and may assert the abort status signals.

Figure 3:
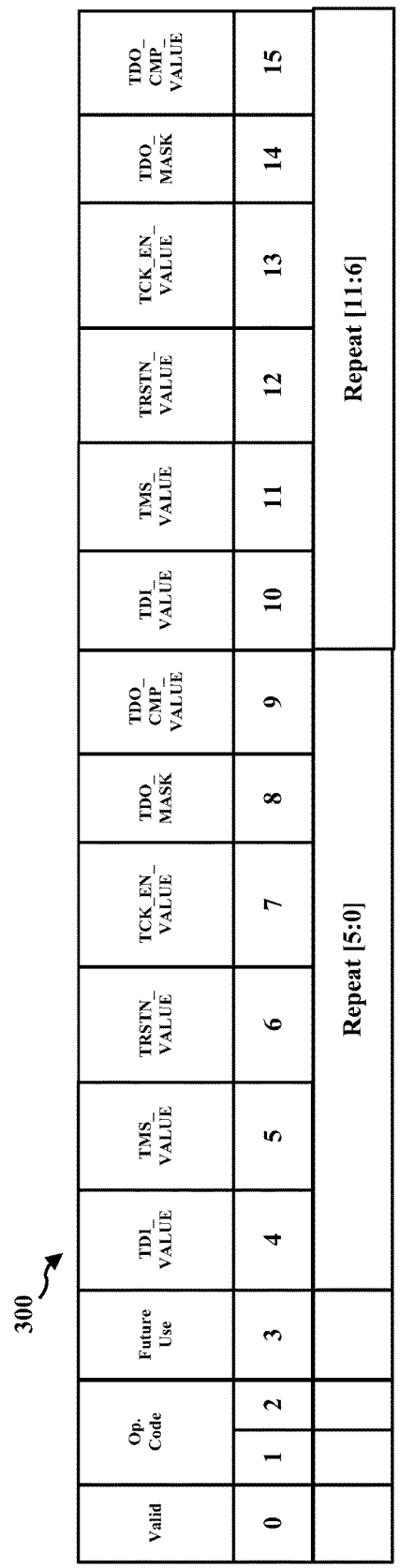
FIG. 3 illustrates one example of an encoding scheme for a 16-bit test vector that is stored in the ROM of the self-test controller shown in FIGS. 1 and 2.

FIG. 3 illustrates one example of an encoding scheme for a 16-bit test vector that is stored in the ROM 104. As mentioned above, the memory data FSM 110 is configured to receive a 64-bit data word from the ROM 104 during each particular upload. Thus, four of the 16-bit test vectors shown in FIG. 3 may be received in a data word for every read operation from the ROM 104 by the memory data FSM 110.

As shown in FIG. 3, the 0 bit of the 16-bit test vector is a valid bit. The valid bit is used by the memory data FSM 110 to determine if the information fields of the test vector are valid. Bits 1-2 of the 16-bit test vector are utilized as a 2-bit operational code. The memory data FSM 110 is configured to read the 2-bit operational code in the 16-bit test vector to determine what information is encoded in the encoded test vector shown in FIG. 3.

When the operational code is 00, the operational code is indicating that Bits 4-16 all include test data for a JTAG test vector. The operational code may be 00 regardless of whether the self-test controller 100 is implementing BIST serially or in parallel. Bit 3 is currently reserved and may be specified in the future. Bit 4 is used to represent a TDI_VALUE of a JTAG vector. Bit 5 is used to represent a TMS_VALUE of a JTAG vector. Bit 6 is used to represent a TRSTN_VALUE of a JTAG vector. Bit 7 is used to represent a TCK_EN_VALUE of a JTAG vector. Bit 8 is used to represent a TDO_MASK value of a JTAG vector. Bit 9 is used to represent a TDO_CMP_VALUE of a JTAG vector. Bit 10 is used to represent a TDI_VALUE of a JTAG vector. Bit 11 is used to represent a TMS_VALUE of a JTAG vector. Bit 12 is used to represent another TRSTN_VALUE of a JTAG vector. Bit 13 is used to represent another TCK_EN_VALUE of a JTAG vector. Bit 14 is used to represent another TDO_MASK value of a JTAG vector. Bit 15 is used to represent another TDO_CMP_VALUE of a JTAG vector. In response to the operational code 00, the memory data FSM 110 is configured to generate a JTAG vector with the test data from bits 4-9 and another JTAG vector with the test data from bits 10-15 of the test vector shown in FIG. 3.

When the operational code is 11, the self-test controller 100 may implement multiple BISTs on various enabled test cores in parallel. As in the previous case, Bits 4-9 include test data. Bit 4 is used to represent a TDI_VALUE of a JTAG vector. Bit 5 is used to represent a TMS_VALUE of a JTAG vector. Bit 6 is used to represent a TRSTN_VALUE of a JTAG vector. Bit 7 is used to represent a TCK_EN_VALUE of a JTAG vector. Bit 8 is used to represent a TDO_MASK value of a JTAG vector. Bit 9 is used to represent a TDO_CMP_VALUE of a JTAG vector. However, in this case, operational code is 11 indicates bits 10-15 include a test core identifier that identifies a test core that the test vector is directed to. As such, the memory data FSM 110 is configured to determine whether the corresponding test core identified by the test core identifier of the test vector is in the subset of the plurality of the test cores that are test enabled by the configuration parameters in the AHB/AXI configuration register block 102. The memory data FSM 110 is configured to generate a JTAG vector that includes the test data in bits 4-9 of the test vector in response to determining that the corresponding test core identified by the test core identifier of the test vector is in the subset of the plurality of the test cores that are test enabled by the configuration parameters in the AHB/AXI configuration register block 102. However, in response to the configuration parameters in the AHB/AXI configuration register block 102 indicating that the test core identified by the test core identifier of the test vector is test disabled, the memory data FSM 110 simply ignores the test vector. In this manner, the test pattern may be written as assuming all of the BISTs of a test pattern are being implemented and the memory data FSM 110 can simply check the AHB/AXI configuration register block 102 to determine if a particular test core is test enabled. As such, every test pattern for every possible combination of test cores that may be enabled or disabled do not have to be written into the ROM 104 for parallel operations. This encoding scheme thus provides significant savings in storage space particularly when the number of test cores is high.

When the operational code is 01, the self-test controller 100 may implement BISTs on enabled test cores in series. Additionally, when the operational code is 01, the ROM 104 is configured to store the encoded test vector to include a repetition value in bits 4-9 and test data in bits 10-15. Bit 10 is used to represent a TDI_VALUE of a JTAG vector. Bit 11 is used to represent a TMS_VALUE of a JTAG vector. Bit 12 is used to represent another TRSTN_VALUE of a JTAG vector. Bit 13 is used to represent another TCK_EN_VALUE of a JTAG vector. Bit 14 is used to represent another TDO_MASK value of a JTAG vector. Bit 15 is used to represent another TDO_CMP_VALUE of a JTAG vector.

The operational code 01 indicates that the test data in bits 10-15 is repetitive and should be repeated for a set of JTAG vectors where a number of repetitions of the JTAG vector is based on the repetition value in bits 4-9 of the test vector shown in FIG. 3. Accordingly, the memory data FSM 110 is configured to generate the set of the JTAG vectors by decoding the test vector shown in FIG. 3 so each of the JTAG vectors in the set of JTAG vectors includes a copy of the test data in bits 10-15. In this manner, a test pattern may be written without always repeating repetitive test data and thus the encoding scheme allows for significant saving of storage in the ROM 104.

When the operational code is 10, the self-test controller 100 may implement BISTs on enabled test cores in series. Furthermore, when the operational code is 10, the ROM 104 is configured to store the encoded test vector to include a repetition value in bits 4-9 and a repetition value in bits 10-15. Accordingly, the operational code 10 indicates that test data in a previous test vector is repetitive. For example, the ROM 114 may be configured to store an encoded test vector that includes the test data in bits 4-9 and in bits 10-15 with an operational code of 00 as explained above. The ROM 114 may then be configured to store another encoded test vector that include a repetition value in bits 4-9 and a repetition value in bits 10-15 with the operational code 10.

The memory data FSM 110 is configured to upload the encoded test vector with the operational code 00 and generate a first JTAG vector with a copy of the test data in bits 4-9 and a second JTAG vectors with a copy of the test data in bits 10-15. The memory data FSM 110 is then configured to upload the encoded test vector with the operational code 10 and generate a first set of JTAG vectors that are copies of the first JTAG vector. The number of JTAG vectors in the first set of JTAG vectors is based on the repetition value in bits 4-9 of the test vector with the operational code of 10. Also, the memory data FSM 110 is configured to generate a second set of JTAG vectors that are copies of the second JTAG vector. The number of JTAG vectors in the second set of JTAG vectors is based on the repetition value in bits 10-15 of the test vector with the operational code of 10. In this manner, a test pattern may be written without always repeating repetitive test data and thus the encoding scheme allows for significant saving of storage in the ROM 104.

FIG. 4 illustrates another example of an encoding scheme for a 16-bit test vector that is stored in the ROM 104. As mentioned above, the memory data FSM 110 is configured to receive a 64-bit data word from the ROM 104 during each particular upload. Thus, four of the 16-bit test vectors shown in FIG. 4 may be received in a data word for every read operation from the ROM 104 by the memory data FSM 110.

As shown in FIG. 4, the 0 bit of the 16-bit test vector is a valid bit. The valid bit is used by the memory data FSM 110 to determine if the information fields of the test vector are valid. Bits 1 of the 16-bit test vector is utilized as a 1-bit operational code. The memory data FSM 110 is configured to read the 1-bit operational code in the 16-bit test vector to determine what information is encoded in the encoded test vector shown in FIG. 4.

When the operational code is 0, the operational code is indicating that Bits 4-16 all include test data for a JTAG test vector. The operational code may be 0 regardless of whether the self-test controller 100 is implementing BIST serially or in parallel. Bits 2 and 3 are currently reserved and may be specified in the future. Bit 4 is used to represent a TDI_VALUE of a JTAG vector. Bit 5 is used to represent a TMS_VALUE of a JTAG vector. Bit 6 is used to represent a TRSTN_VALUE of a JTAG vector. Bit 7 is used to represent a TCK_EN_VALUE of a JTAG vector. Bit 8 is used to represent a TDO_MASK value of a JTAG vector. Bit 9 is used to represent a TDO_CMP_VALUE of a JTAG vector. Bit 10 is used to represent a TDI_VALUE of a JTAG vector. Bit 11 is used to represent a TMS_VALUE of a JTAG vector. Bit 12 is used to represent another TRSTN_VALUE of a JTAG vector. Bit 13 is used to represent another TCK_EN_VALUE of a JTAG vector. Bit 14 is used to represent another TDO_MASK value of a JTAG vector. Bit 15 is used to represent another TDO_CMP_VALUE of a JTAG vector. In response to the operational code 0, the memory data FSM 110 is configured to generate a JTAG vector with the test data from bits 4-9 and another JTAG vector with the test data from bits 10-15 of the test vector shown in FIG. 4.

When the operational code is 1, the self-test controller 100 may implement multiple BISTs on various enabled test cores in parallel. As in the previous case, Bits 10-15 include test data. Bit 10 is used to represent a TDI_VALUE of a JTAG vector. Bit 11 is used to represent a TMS_VALUE of a JTAG vector. Bit 12 is used to represent a TRSTN_VALUE of a JTAG vector. Bit 13 is used to represent a TCK_EN_VALUE of a JTAG vector. Bit 14 is used to represent a TDO_MASK value of a JTAG vector. Bit 15 is used to represent a TDO_CMP_VALUE of a JTAG vector. However, in this case, operational code is 1 indicates bits 4-9 include a repeat count for the next test vector. The memory data FSM 110 is configured to upload the encoded test vector with the operational code 1 and obtain the repetition value. The memory data FSM 110 is then configured to upload the encoded test vector with the operational code 0 and generate a set of JTAG vectors each with copies of the test data in bits 4-9 of the test vector with the operational code of 0. The number of JTAG vectors in the set of JTAG vectors is provided in accordance with the repetition value obtained from the encoded test vector with the operational code 1. In this manner, a test pattern may be written without always repeating repetitive test data and thus the encoding scheme allows for significant saving of storage in the ROM 104.

FIG. 5 illustrates another example of an encoding scheme for a 64-bit test vector that is stored in the ROM 104. As mentioned above, the memory data FSM 110 is configured to receive a 64-bit data word from the ROM 104 during each particular upload. In this case, one of the 64-bit test vectors shown in FIG. 5 may be received in a data word for every read operation from the ROM 104 by the memory data FSM 110.

As shown in FIG. 5, the 0 bit of the 64-bit test vector is a valid bit. The valid bit is used by the memory data FSM 110 to determine if the information fields of the test vector are valid. Bits 1-3 of the 64-bit test vector is utilized as a 3-bit operational code. The memory data FSM 110 is configured to read the 3-bit operational code in the 64-bit test vector to determine what information is encoded in the encoded test vector shown in FIG. 5. Bit 4 is a bit utilized to determine if bits 5-63 are all data bits or whether bits 5-8 indicate the length of the data to be taken from bits 9-63. More specifically, if bit 4 is 0 then bits 5-63 are considered test data. However, if bit 4 is 1, then bits 5-8 indicate a bit length. The memory data FSM 110 is configured to obtain a subset of the bits 9-63 as test data.

As shown in FIG. 5, when bits 1-3 are 000, there is no data in bits 5-63 or 9-63. When bits 1-3 are 001, there is TDI in bits 5-63 or 9-63. When bits 1-3 are 010, there is TMS in bits 5-63 or 9-63. When bits 1-3 are 011, there is TRSTN in bits 5-63 or 9-63. When bits 1-3 are 100, there is TCK_EN in bits 5-63 or 9-63. When bits 1-3 are 101, there is TDO_MASK in bits 5-63 or 9-63. When bits 1-3 are 110, there is TDO COMP in bits 5-63 or 9-63.

Figure 6:
FIG. 6 illustrates one example of an encoding scheme for a 64-bit test vector that is stored in the ROM of the self-test controller shown in FIGS. 1 and 2.

FIG. 6 illustrates another example of an encoding scheme for a 64-bit test vector that is stored in the ROM 104. As mentioned above, the memory data FSM 110 is configured to receive a 64-bit data word from the ROM 104 during each particular upload. In this case, one of the 64-bit test vectors shown in FIG. 6 may be received in a data word for every read operation from the ROM 104 by the memory data FSM 110.

As shown in FIG. 6, the 0 bit of the 64-bit test vector is a valid bit. The valid bit is used by the memory data FSM 110 to determine if the information fields of the test vector are valid. Bits 1-3 of the 64-bit test vector is utilized as a 3-bit operational code. The memory data FSM 110 is configured to read the 3-bit operational code in the 64-bit test vector to determine what information is encoded in the encoded test vector shown in FIG. 6. Bit 4 is a bit utilized to determine if bits 5-63 are all data bits or whether bits 5-8 indicate the length of the data to be taken from bits 9-63. More specifically, if bit 4 is 0 then bits 5-63 are considered test data. However, if bit 4 is 1, then bits 5-8 indicate a bit length. The memory data FSM 110 is configured to obtain a subset of the bits 9-63 as test data.

In FIG. 6, the operational code indicates an instruction type for the JTAG interface 112. When bits 1-3 are 000, a NOP instruction is indicated which indicates that a device was detected but the JTAG identifier was not recognized. When bits 1-3 are 001, the Load IR instruction is indicated which indicates that an instruction register in the JTAG interface 112 is to be loaded with TDO test data. When bits 1-3 are 010, the Load DR instruction is indicated which indicates that a data register in the JTAG interface is to be loaded with TDI test data. When bits 1-3 are 011, the Load DR Append instruction is indicated which indicates that the test data in data register in the JTAG interface should be appended with TDI test data. When bits 1-3 are 100, the Capture DR instruction is indicated which indicates that the test data in data register should be captured and loaded into a shift register as captured TDO mask data. When bits 1-3 are 101, the Capture DR instruction is indicated which indicates that the test data in data register should be captured and loaded into a shift register as captured TDO compare data.

Figure 7:
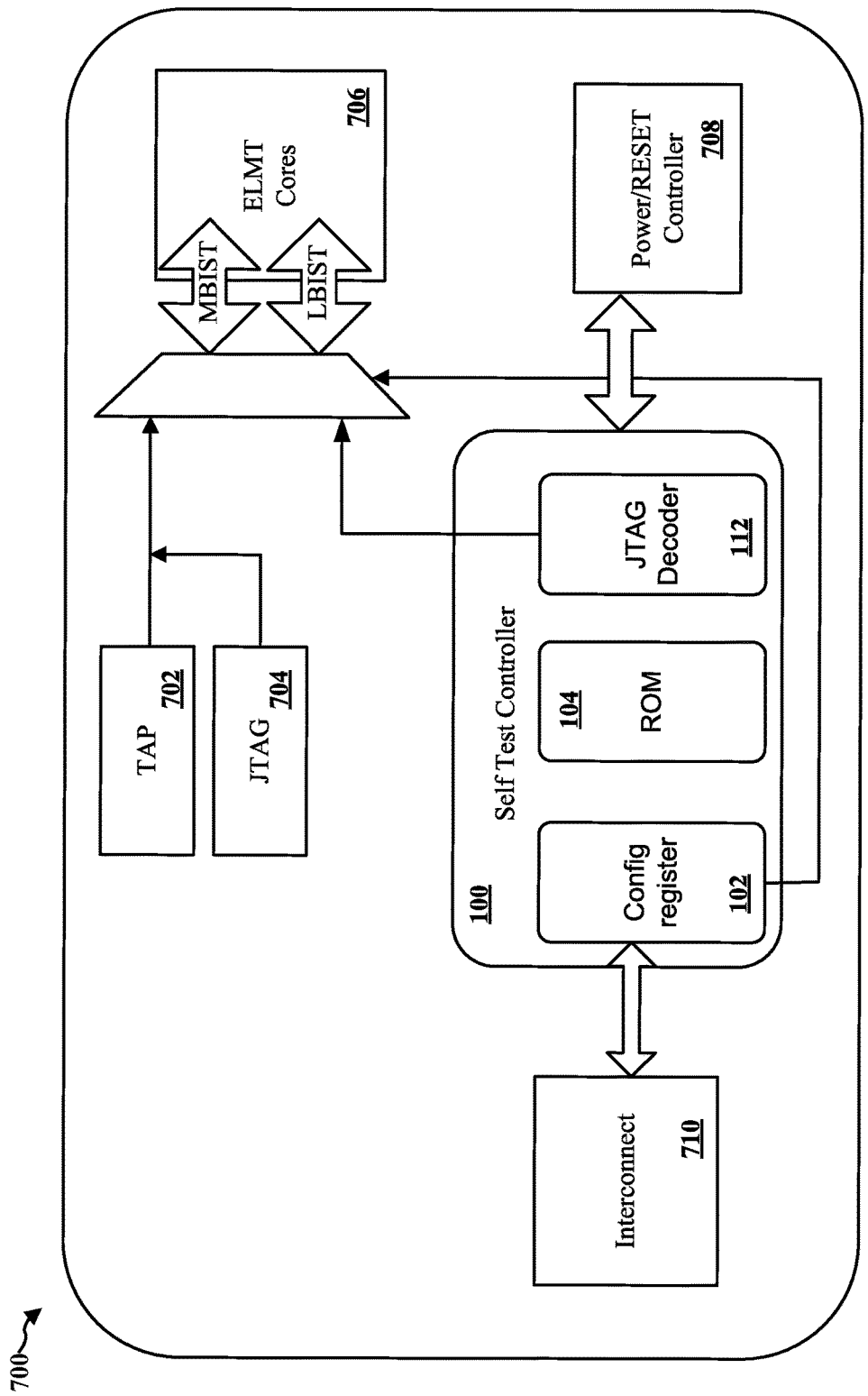
FIG. 7 is a diagram illustrating self-test controller integration details.

FIG. 7 is a diagram illustrating self-test controller integration details 700. The embedded logic and memory test (ELMT) core 706 may have LBIST and MBIST integrated within. When operating a BIST, the JTAG interface of LBIST/MBIST is intercepted and controlled via the self-test controller 100. All the vectors are applied in the form of a JTAG sequence through the self-test controller 100. The self-test controller may be coupled to a power/reset controller 708, which may provide power and/or reset the self-test controller. The self-test controller 100 may also be coupled to an interconnect block 710. As illustrated in FIG. 3, the self-test controller 100 may interface with the ELMT cores 706 for testing. Testing may also be performed through an external tester through the test access port (TAP) block 702 and JTAG block 704.

Figure 8:
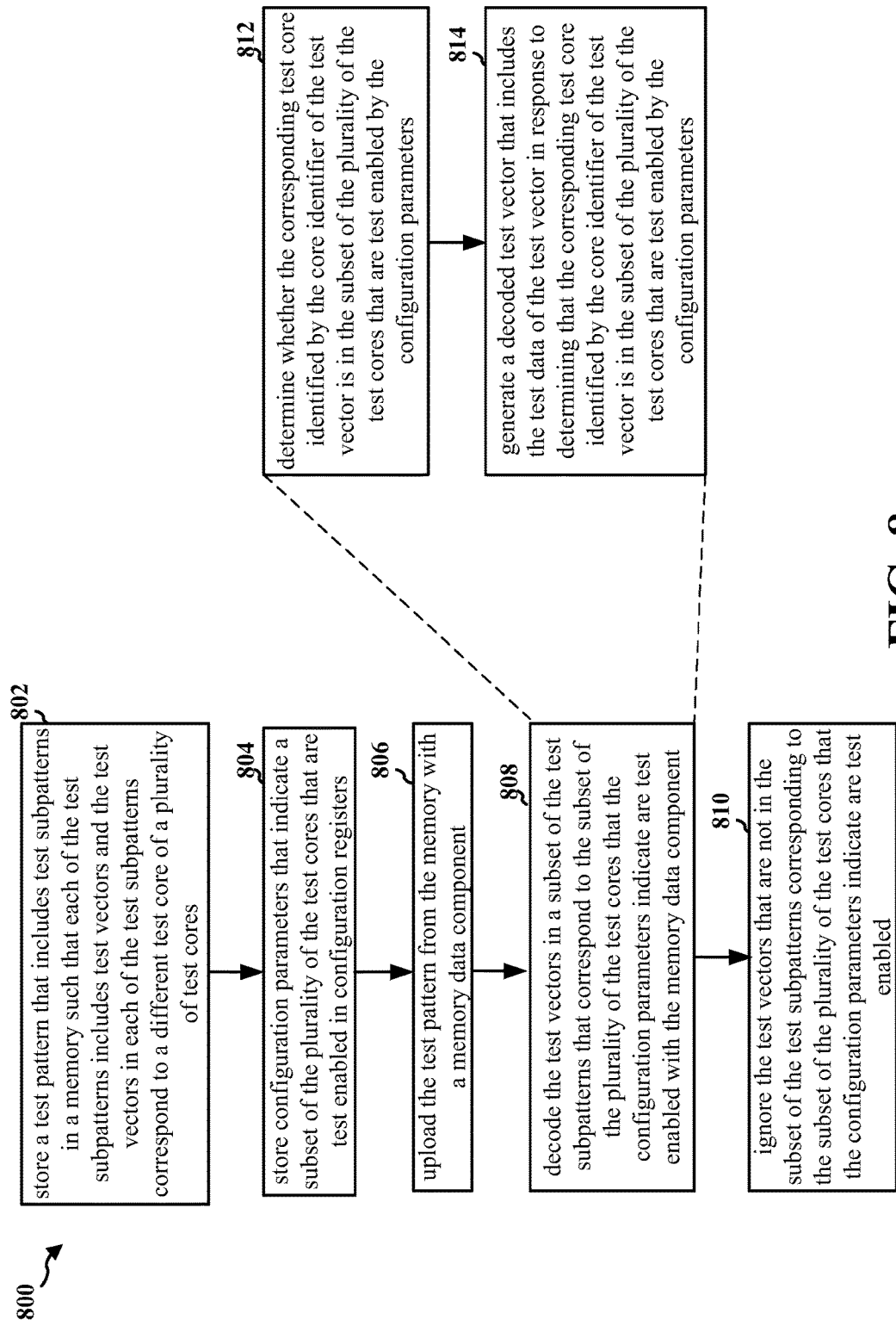
FIG. 8 is a flowchart that illustrates an exemplary method that may be performed by the self-test controller shown in FIGS. 1 and 2.

FIG. 8 illustrates an exemplary flowchart 800 illustrating an exemplary method that may be performed by an apparatus, such as the self-test controller 100 described above and shown in FIG. 1 and FIG. 2. At 802, the apparatus stores a test pattern that includes test subpatterns in a memory (e.g., the ROM 104) such that each of the test subpatterns includes test vectors and the test vectors in each of the test subpatterns correspond to a different test core of a plurality of test cores (e.g., ELMT cores 706). Furthermore, the apparatus may store configuration parameters that indicate a subset of the plurality of the test cores that are test enabled in configuration registers, at 804. The apparatus may then upload the test pattern from the memory with a memory data component (e.g., the memory data FSM 110) at 806. As explained above, this may be done through the address pointer generation block 108, which determines the start address and the end address of a test pattern and provides the start address and the end address to the memory data FSM 110.

At 808, the apparatus may decode the test vectors in a subset of the test subpatterns that correspond to the subset of the plurality of the test cores that the configuration parameters indicate are test enabled with the memory data component. In this manner, the test pattern may be stored in the memory assuming that all BIST are being implemented for all of the test cores. The memory data component may then select which test vectors to decode for BIST based on the configuration parameters that indicate which of the test cores are test enabled. Accordingly, at 810, the apparatus may ignore the test vectors that are not in the subset of the test subpatterns corresponding to the subset of the plurality of the test cores that the configuration parameters indicate are test enabled.

In some aspects, the apparatus may decode the test vectors by generating JTAG vectors, which may then be output to a JTAG interface (i.e., JTAG interface 112). Accordingly, since the memory stored an encoded test pattern, the decoding by the apparatus may result in the apparatus generating a JTAG pattern that includes JTAG subpatterns such that each of the JTAG subpatterns includes JTAG vectors. The JTAG subpatterns may each correspond to different one of the subset of the plurality of the test cores that the configuration parameters indicate are test enabled. The apparatus may thus apply the JTAG pattern to the subset of the plurality of the test cores through the JTAG interface such that the JTAG subpatterns are implemented in parallel by the subset of the plurality of the test cores.

In some aspects, the memory is configured to store the test vectors of the test subpatterns such that each of the test vectors is encoded to include test data and a core identifier that identifies the corresponding test core of the plurality of test cores. To perform 808, the apparatus may, for each test vector of the test vectors, determine whether the corresponding test core identified by the core identifier of the test vector is in the subset of the plurality of the test cores that are test enabled by the configuration parameters at 812. The apparatus may then generate a decoded test vector that includes the test data of the test vector in response to determining that the corresponding test core identified by the core identifier of the test vector is in the subset of the plurality of the test cores that are test enabled by the configuration parameters at 814. In some aspects, the test pattern is part of another test pattern, which may be referred to as a slice. Thus, the memory may store another test pattern such that the test pattern is a test subpattern included as a slice of the other test pattern. Through the encoding scheme significant storage space can be saved in the memory as every test pattern for every test core that may or may not be test enabled has to be stored in order to provide dynamic selection of BISTs to be implemented.

Figure 9:
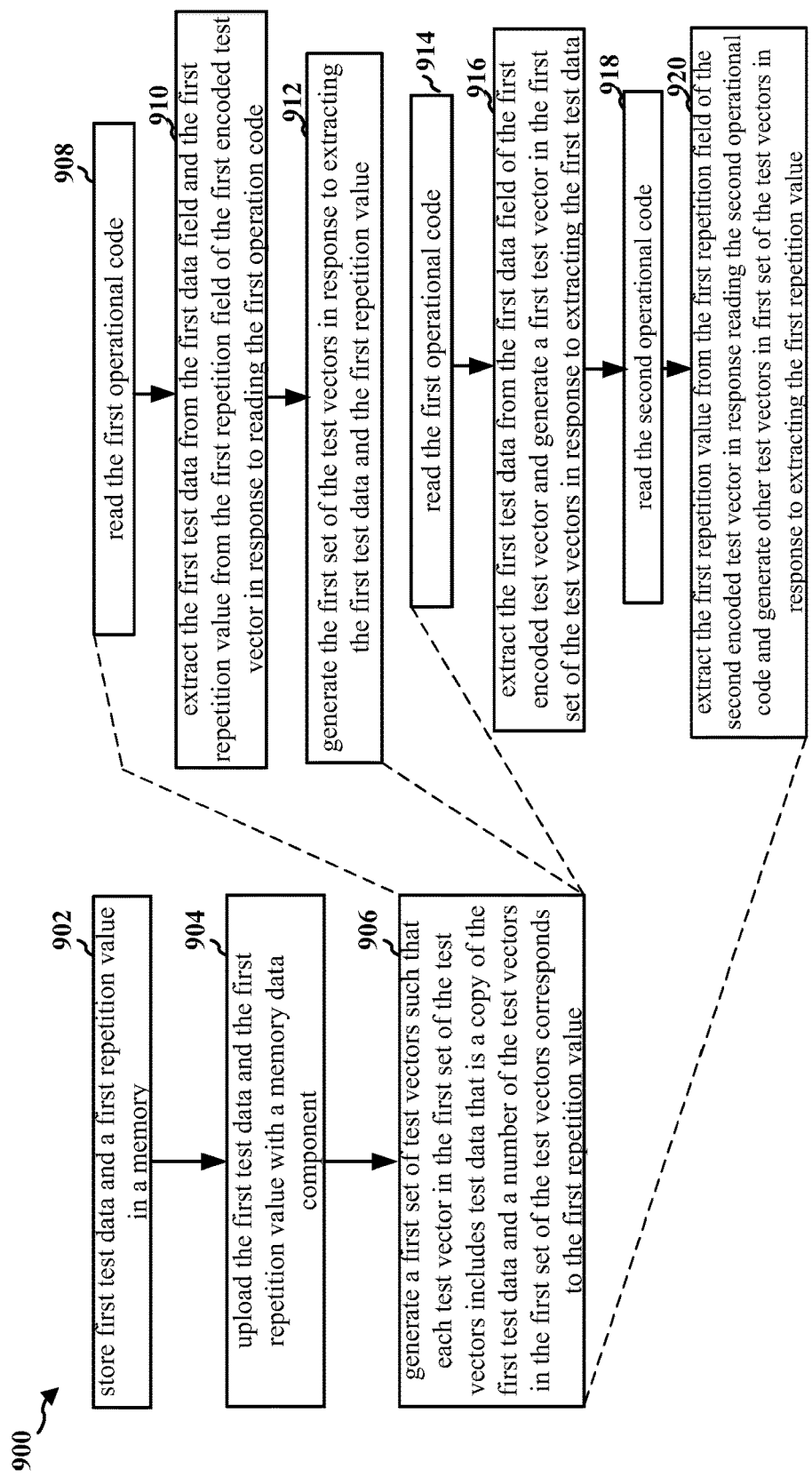
FIG. 9 is another flowchart that illustrates an exemplary method that may be performed by the self-test controller shown in FIGS. 1 and 2.

FIG. 9 illustrates a flowchart 900 that describes an exemplary method performed by an apparatus. The apparatus may be the self-test controller 100 described above. At 902, the apparatus may store first test data and a first repetition value in a memory (e.g., ROM 104). The apparatus may upload the first test data and the first repetition value with a memory data component (e.g., the memory data FSM 110) at 904. At 906, the apparatus may generate a first set of test vectors such that each test vector in the first set of the test vectors includes test data that is a copy of the first test data and a number of the test vectors in the first set of the test vectors corresponds to the first repetition value. In this manner, by utilizing the first repetition value, multiple copies of the same test vector do not have to be stored in the memory.

In some aspects, the apparatus may store a first encoded test vector that includes the first test data and the first repetition value in the memory, which is an implementation of 902. This corresponds to the implementation in FIG. 3 associated with the operational code 01. Accordingly, the apparatus may upload the first test data and the first repetition value from the memory at 904 by uploading the first encoded test vector from the memory with the memory data component. Additionally, the apparatus may generate the first set of the test vectors at 906 by decoding the first encoded test vector so as to generate the first set of the test vectors with the memory data component.

In some aspects, the apparatus may upload a test pattern by uploading data words in the test pattern. The first encoded test vector described above may be provided in one of those data words. Other encoded test vectors may also be provided as part of the data word. In one example described above, each encoded test vector is 16 bits while the data words are 64 bits and thus each data word includes 4 16-bit vectors. The apparatus may progress through the data words by decoding the 4 16-bit vectors in each data word until all of the data words in the test pattern have been decoded. Accordingly, in some aspects, the apparatus may store a data word that includes the first encoded test vector in the memory wherein uploading the first encoded test vector comprises uploading the data word from the memory. The apparatus may thus decode each of the encoded test vectors in the plurality of the encoded test vectors, which includes decoding the first encoded test vector so as to generate the first set of the test vectors.

In some aspects, the first set of the test vectors generated from the first encoded test vector may be a first set of JTAG vectors. In this manner, a sequence of JTAG vectors may be provided to the JTAG interface 112 so that BISTs may be implemented serially by the test cores (e.g., ELMT cores 706).

In one aspect, an operational code is utilized to describe the data fields and structure of the encoded test vectors in a test pattern. The operational codes integrated into the encoded test vectors allow for a more compact arrangement as this allows for less repetitions of the same test data. For example, the memory (e.g., ROM 104) is configured to store the first encoded test vector such that the first encoded test vector is encoded with a first operational code (e.g., operational code 01 in FIG. 3 above) that indicates that the first encoded test vector includes a first data field with the first test data and a first repetition field with the first repetition value. In one implementation of 906, the apparatus may read the first operational code at 908. The apparatus may then extract the first test data from the first data field and the first repetition value from the first repetition field of the first encoded test vector in response to reading the first operational code at 910. The apparatus may then generate the first set of the test vectors in response to extracting the first test data and the first repetition value at 912.

In another aspect, the test data and the repetition value are stored in separate test vectors, as explained above with respect to operational code 10 described above with respect to FIG. 3. Thus, in some aspects, the apparatus may be storing a first encoded test vector that includes the first test data and a second encoded test vector that includes the first repetition value in the memory, which is an implementation of 902. The apparatus may upload the first test data and the first repetition value from the memory at 904 by uploading the first encoded test vector and the second encoded test vector from the memory. Additionally, the apparatus may generate the first set of the test vectors at 906 by decoding the first encoded test vector and the second encoded test vector so as to generate the first set of the test vectors.

In some aspects, the apparatus may upload a test pattern by uploading data words in the test pattern. The first encoded test vector that includes the test data and the second encoded test vector that includes the repetition value may be provided in one or more of those data words. Other encoded test vectors may also be provided as part of the data word. In one example described above, each encoded test vector is 16 bits while the data words are 64 bits and thus each data word includes 4 16-bit vectors. The apparatus may progress through the data words by decoding the 4 16-bit vectors in each data word until all of the data words in the test pattern have been decoded. Accordingly, in some aspects, the apparatus may store a data word that includes the first encoded test vector in the memory wherein uploading the first encoded test vector comprises uploading the data word from the memory. The apparatus may thus decode each of the encoded test vectors in the plurality of the encoded test vectors, which includes decoding the first encoded test vector and the second encoded test vector so as to generate the first set of the test vectors.

In some aspects, the first set of the test vectors generated from the first encoded test vector and the second encoded test vector may be a first set of JTAG vectors. In this manner, a sequence of JTAG vectors may be provided to the JTAG interface 112 so that BISTs may be implemented serially by the test cores (e.g., ELMT cores 706).

In one aspect, an operational code is utilized to describe the data fields and structure of the encoded test vectors in a test pattern. The operational codes integrated into the encoded test vectors allow for a more compact arrangement as this allows for less repetitions of the same test data. For example, the memory (e.g., ROM 104) is configured to store the first encoded test vector such that the first encoded test vector is encoded with a first operational code that indicates that the first encoded test vector includes a first data field with the first test data (e.g., operational code 00 in FIG. 3 above) and to store the second encoded test vector such that the second encoded test vector is encoded with a second operational code that indicates that the second encoded test vector includes a first repetition field with the first repetition value (e.g., operational code 10 in FIG. 3 above). In one implementation of 906, the apparatus may read the first operational code at 914. The apparatus may then extract the first test data from the first data field of the first encoded test vector and generate a first test vector in the first set of the test vectors in response to extracting the first test data at 916. Also, the apparatus may read the second operational code at 918. The apparatus may then extract the first repetition value from the first repetition field of the second encoded test vector in response reading the second operational code and generate other test vectors in first set of the test vectors in response to extracting the first repetition value at 920.

The self-test controller 100 may be the apparatus that implements the procedures described above with respect to FIG. 7. The self-test controller 100 includes a memory 104, configuration registers 102, and a memory data component 110. The memory 104 is configured to store a test pattern that includes test subpatterns such that each of the test subpatterns includes test vectors and the test vectors in each of the test subpatterns correspond to a different test core of a plurality of test cores 706. The configuration registers 102 are configured to store configuration parameters that indicate a subset of the plurality of the test cores 706 that are test enabled. Additionally, the memory data component 110 is configured to upload the test pattern and decode the test vectors in a subset of the test subpatterns that correspond to the subset of the plurality of the test cores that the configuration parameters indicate are test enabled. Furthermore, the memory data component is configured to ignore the test vectors that are not in the subset of the test subpatterns corresponding to the subset of the plurality of the test cores that the configuration parameters indicate are test enabled.

In one aspect, the memory data component 110 is configured to decode the test vectors in the subset of the test subpatterns so as to generate JTAG test vectors. Accordingly, the memory data component 110 may generate a JTAG pattern that includes JTAG subpatterns such that each of the JTAG subpatterns includes JTAG vectors corresponding to different one of the subset of the plurality of the test cores 706 that the configuration parameters indicate are test enabled. The self-test controller 100 may further include a JTAG interface 112 operably associated with the plurality of the test cores 706. The memory data component 110 is configured to apply the JTAG pattern to the subset of the plurality of the test cores 706 through the JTAG interface 112 such that the JTAG subpatterns are implemented in parallel by the subset of the plurality of the test cores.

In one implementation, the memory 104 is configured to store the test vectors of the test subpatterns such that each of the test vectors is encoded to include test data and a core identifier that identifies a corresponding test core of the plurality of test cores 706. The memory data component 110 may be configured to decode the test vectors in the subset of the test subpatterns that correspond to the subset of the plurality of the test cores that are test enabled by: 1) for each test vector of the test vectors, determining whether the corresponding test core identified by the core identifier of the test vector is in the subset of the plurality of the test cores that are test enabled by the configuration parameters, and 2) generating a decoded test vector that includes the test data of the test vector in response to determining that the corresponding test core identified by the core identifier of the test vector is in the subset of the plurality of the test cores that are test enabled by the configuration parameters.

In one aspect, the memory 104 is configured to store another test pattern such that the test pattern is a test subpattern included as a slice of the other test pattern. In some aspect, the memory data component 110 is a memory data finite state machine. In still other aspects, the memory 104 is read only memory (ROM). Additionally, the configuration registers 102 may be advanced microcontroller bus architecture (AMBA) registers and/or advanced extensible interface (AXI) registers.

In some implementations, the memory 104 is configured to store first test data and a first repetition value. The memory data component 110 may be configured to upload the first test data and the first repetition value from the memory 104. The memory data component 110 may be configured to generate a first set of test vectors such that each test vector in the first set of the test vectors includes test data that is a copy of the first test data and a number of the test vectors in the first set of the test vectors corresponds to the first repetition value.

In one aspect, the memory 104 is configured to store a first encoded test vector that includes the first test data and the first repetition value. The memory data component 110 is configured to upload the first test data and the first repetition value from the memory 104 by uploading the first encoded test vector from the memory 104 and is configured to generate the first set of the test vectors by decoding the first encoded test vector so as to generate the first set of the test vectors.

In some implementations, the memory 104 is configured to store a data word that includes the first encoded test vector and the memory data component 110 is configured to upload the first encoded test vector by uploading the data word. The data word includes a plurality of encoded test vectors such that the plurality of encoded test vectors includes the first encoded test vector and the memory data component 110 is configured to decode each of the encoded test vectors in the plurality of the encoded test vectors, which includes decoding the first encoded test vector so as to generate the first set of the test vectors.

In some implementations, the first set of the decoded test vectors are a first set of JTAG vectors. The memory 104 is configured to store the first encoded test vector such that the first encoded test vector is encoded with a first operational code that indicates that the first encoded test vector includes a first data field with the first test data and a first repetition field with the first repetition value. The memory data component 110 is configured to decode the first encoded test vector so as to generate the first set of the test vectors by reading the first operational code, extracting the first test data from the first data field and the first repetition value from the first repetition field of the first encoded test vector in response to reading the first operational code, and generating the first set of the test vectors in response to extracting the first test data and the first repetition value.

In another implementation, the memory 104 is configured to store a first encoded test vector that includes the first test data and a second encoded test vector that includes the first repetition value. The memory data component 110 is configured to upload the first test data and the first repetition value from the memory 104 by uploading the first encoded test vector and the second encoded test vector from the memory 104. The memory data component 110 is also configured to generate the first set of the test vectors by decoding the first encoded test vector and the second encoded test vector so as to generate the first set of the test vectors.

In one aspect, the memory 104 is configured to store a data word that includes the first encoded test vector and the second encoded test vector. The memory data component 110 is configured to upload the first encoded test vector and the second encoded test vector by uploading the data word. For example, the data word includes a plurality of encoded test vectors such that the plurality of encoded test vectors includes the first encoded test vector and the second encoded test vector. The memory data component 110 is configured to decode each of the encoded test vectors in the plurality of the encoded test vectors, which includes decoding the first encoded test vector and the second encoded test vector so as to generate the first set of the test vectors.

In another aspect, the memory 104 is configured to store the first encoded test vector such that the first encoded test vector is encoded with a first operational code that indicates that the first encoded test vector includes a first data field with the first test data and to store the second encoded test vector such that the second encoded test vector is encoded with a second operational code that indicates that the second encoded test vector includes a first repetition field with the first repetition value. The memory data component 110 is configured to decode the first encoded test vector and the second encoded test vector so as to generate the first set of the test vectors by reading the first operational code, extracting the first test data from the first data field of the first encoded test vector, generating a first test vector in the first set of the test vectors in response to extracting the first test data, reading the second operational code, extracting the first repetition value from the first repetition field of the second encoded test vector in response reading the second operational code, and generating other test vectors in first set of the test vectors in response to extracting the first repetition value.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The apparatus may include additional components that perform each of the blocks of the algorithm in the aforementioned flowcharts of FIGS. 8-9. As such, each block in the aforementioned flowcharts of FIGS. 8-9 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof. The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. The term "connected" means "directly connected." The term "coupled" means "connected" or "indirectly connected" through other elements. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A self-test controller, comprising:
   a memory configured to store a first test pattern that includes test subpatterns such that each of the test subpatterns includes test vectors and the test vectors in each of the test subpatterns correspond to a different test core of a plurality of test cores;
   configuration registers configured to store configuration parameters that indicate a subset of the plurality of the test cores that are test enabled; and
   a memory data component configured to upload the first test pattern and decode the test vectors in a subset of the test subpatterns that correspond to the subset of the plurality of the test cores that the configuration parameters indicate are test enabled.

2. The self-test controller of claim 1, wherein the memory data component is configured to ignore the test vectors that are not in the subset of the test subpatterns corresponding to the subset of the plurality of the test cores that the configuration parameters indicate are test enabled.

3. The self-test controller of claim 1, wherein the memory data component is configured to decode the test vectors in the subset of the test subpatterns to generate self-test test vectors.

4. The self-test controller of claim 1, further comprising an interface operably associated with the plurality of the test cores, wherein the memory data component is configured to:
   decode the test vectors in the subset of the test subpatterns so as to generate a self-test pattern that includes self-test subpatterns such that each of the self-test subpatterns includes self-test vectors corresponding to different ones of the subset of the plurality of the test cores that the configuration parameters indicate are test enabled; and
   apply the self-test pattern to the subset of the plurality of the test cores through the interface such that the self-test subpatterns are implemented in parallel by the subset of the plurality of the test cores.

5. The self-test controller of claim 1, wherein the memory is configured to store the test vectors of the test subpatterns such that each of the test vectors is encoded to include test data and a core identifier that identifies the corresponding test core of the plurality of test cores.

6. The self-test controller of claim 1, wherein the memory is configured to store a second test pattern such that the first test pattern is a test subpattern included as a slice of the second test pattern.

7. The self-test controller of claim 1 wherein the memory data component comprises a memory data finite state machine.

8. The self-test controller of claim 1, wherein:
   the memory is further configured to store a first encoded test vector that includes a first data field with first test data, a first repetition field with a first repetition value, and a first operational code that indicates that the first encoded test vector includes the first data field with the first test data and the first repetition field with the first repetition value; and the memory data component is configured to:
upload the first encoded test vector from the memory;
read the first operational code;
extract the first test data from the first data field and the first repetition value from the first repetition field of the first encoded test vector in response to reading the first operational code; and
generate a first set of test vectors in response to extracting the first test data and the first repetition value, wherein each test vector in the first set of the test vectors includes test data that is a copy of the first test data and a number of the test vectors in the first set of the test vectors corresponds to the first repetition value.

9. The self-test controller of claim 1, wherein:
the memory is further configured to store a first encoded test vector and a second encoded test vector wherein the first encoded test vector includes a first data field with first test data and a first operational code that indicates that the first encoded test vector includes the first data field and wherein the second encoded test vector includes a first repetition field with a first repetition value and a second operational code that indicates that the second encoded test vector includes the first repetition field; and
the memory data component is further configured to:
upload the first encoded test vector from the memory;
read the first operational code;
extract the first test data from the first data field of the first encoded test vector in response to reading the first operational code;
generate a first test vector in a first set of the test vectors in response to extracting the first test data;
upload the second encoded test vector from the memory;
read the second operational code;
extract the first repetition value from the first repetition field of the second encoded test vector in response to reading the second operational code; and
generate other test vectors in the first set of the test vectors in response to extracting the first repetition value, wherein each test vector in the first set of the test vectors includes test data that is a copy of the first test data and a number of the test vectors in the first set of the test vectors corresponds to the first repetition value.

10. A method, comprising:
storing a first test pattern that includes test subpatterns in a memory such that each of the test subpatterns includes test vectors and the test vectors in each of the test subpatterns correspond to a different test core of a plurality of test cores;
storing configuration parameters that indicate a subset of the plurality of the test cores that are test enabled in configuration registers;
uploading the first test pattern from the memory with a memory data component; and
decoding the test vectors in a subset of the test subpatterns that correspond to the subset of the plurality of the test cores that the configuration parameters indicate are test enabled with the memory data component.

11. The method of claim 10, further comprising ignoring the test vectors that are not in the subset of the test subpatterns corresponding to the subset of the plurality of the test cores that the configuration parameters indicate are test enabled.

12. The method of claim 10, wherein the decoding the test vectors in the subset of the test subpatterns comprises generating self-test test vectors.

13. The method of claim 10, wherein an interface is operably associated with the plurality of the test cores, wherein the decoding the test vectors in the subset of the test subpatterns comprises generating a self-test pattern that includes self-test subpatterns such that each of the self-test subpatterns includes self-test vectors corresponding to different one of the subset of the plurality of the test cores that the configuration parameters indicate are test enabled and wherein the method further comprises:
applying the self-test pattern to the subset of the plurality of the test cores through the interface such that the self-test subpatterns are implemented in parallel by the subset of the plurality of the test cores.

14. The method of claim 10, wherein the memory is configured to store the test vectors of the test subpatterns such that each of the test vectors is encoded to include test data and a core identifier that identifies the corresponding test core of the plurality of test cores.

15. The method of claim 10, wherein the memory is configured to store a second test pattern such that the first test pattern is a test subpattern included as a slice of the second test pattern.

16. The method of claim 10 wherein the memory data component comprises a memory data finite state machine.

17. The method of claim 10, further comprising:
storing a first encoded test vector in the memory, wherein the first encoded test vector includes a first data field with first test data, a first repetition field with a first repetition value, and a first operational code that indicates that the first encoded test vector includes the first data field with the first test data and the first repetition field with the first repetition value; and
uploading the first encoded test vector from the memory to the memory data component;
reading the first operational code;
extracting the first test data from the first data field and the first repetition value from the first repetition field of the first encoded test vector in response to reading the first operational code; and
generating a first set of test vectors in response to extracting the first test data and the first repetition value with the memory data component, wherein each test vector in the first set of the test vectors includes test data that is a copy of the first test data and a number of the test vectors in the first set of the test vectors corresponds to the first repetition value.

18. The method of claim 10, further comprising:
storing a first encoded test vector and a second encoded test vector in the memory wherein the first encoded test vector includes a first data field with first test data and a first operational code that indicates that the first encoded test vector includes the first data field and wherein the second encoded test vector includes a first repetition field with a first repetition value and a second operational code that indicates that the second encoded test vector includes the first repetition field;
uploading the first encoded test vector from the memory to the memory data component;
reading the first operational code;

extracting the first test data from the first data field of the first encoded test vector in response to reading the first operational code;
generating a first test vector in a first set of the test vectors with the memory data component in response to extracting the first test data;
uploading the second encoded test vector from the memory to the memory data component;
reading the second operational code;
extracting the first repetition value from the first repetition field of the second encoded test vector in response to reading the second operational code; and
generating other test vectors in the first set of the test vectors with the memory data component in response to extracting the first repetition value, wherein each test vector in the first set of the test vectors includes test data that is a copy of the first test data and a number of the test vectors in the first set of the test vectors corresponds to the first repetition value.

19. A non-transitory computer-readable medium (CRM) storing computer executable code, comprising code to:
store a first test pattern that includes test subpatterns in a memory such that each of the test subpatterns includes test vectors and the test vectors in each of the test subpatterns correspond to a different test core of a plurality of test cores;
store configuration parameters that indicate a subset of the plurality of the test cores that are test enabled in configuration registers;
upload the first test pattern from the memory with a memory data component; and
decode the test vectors in a subset of the test subpatterns that correspond to the subset of the plurality of the test cores that the configuration parameters indicate are test enabled with the memory data component.

20. The CRM of claim 19, wherein the code is configured to ignore the test vectors that are not in the subset of the test subpatterns corresponding to the subset of the plurality of the test cores that the configuration parameters indicate are test enabled.

21. The CRM of claim 19, wherein the code is configured to decode the test vectors in the subset of the test subpatterns by generating self-test test vectors.

22. The CRM of claim 19, wherein an interface is operably associated with the plurality of the test cores and wherein the code is configured to decode the test vectors in the subset of the test subpatterns by generating a self-test pattern that includes self-test subpatterns such that each of the self-test subpatterns includes self-test vectors corresponding to different one of the subset of the plurality of the test cores that the configuration parameters indicate are test enabled and wherein the code is further configured to apply the self-test pattern to the subset of the plurality of the test cores through the interface such that the self-test subpatterns are implemented in parallel by the subset of the plurality of the test cores.

23. The CRM of claim 19, wherein the memory is configured to store the test vectors of the test subpatterns such that each of the test vectors is encoded to include test data and a core identifier that identifies the corresponding test core of the plurality of test cores.

24. The CRM of claim 19, wherein the memory is configured to store a second test pattern such that the first test pattern is a test subpattern included as a slice of the second test pattern.

25. The CRM of claim 19, wherein the memory data component comprises a memory data finite state machine.

26. The CRM of claim 19, wherein the code is further configured to:
store a first encoded test vector in the memory, wherein the first encoded test vector includes a first data field with first test data, a first repetition field with a first repetition value, and a first operational code that indicates that the first encoded test vector includes the first data field with the first test data and the first repetition field with the first repetition value; and
upload the first encoded test vector from the memory to the memory data component;
read the first operational code;
extract the first test data from the first data field and the first repetition value from the first repetition field of the first encoded test vector in response to reading the first operational code; and
generate a first set of test vectors in response to extracting the first test data and the first repetition value with the memory data component, wherein each test vector in the first set of the test vectors includes test data that is a copy of the first test data and a number of the test vectors in the first set of the test vectors corresponds to the first repetition value.

27. The CRM of claim 19, wherein the code is further configured to:
store a first encoded test vector and a second encoded test vector in the memory wherein the first encoded test vector includes a first data field with first test data and a first operational code that indicates that the first encoded test vector includes the first data field and wherein the second encoded test vector includes a first repetition field with a first repetition value and a second operational code that indicates that the second encoded test vector includes the first repetition field;
upload the first encoded test vector from the memory to the memory data component;
read the first operational code;
extract the first test data from the first data field of the first encoded test vector in response to reading the first operational code;
generate a first test vector in a first set of the test vectors with the memory data component in response to extracting the first test data;
upload the second encoded test vector from the memory to the memory data component;
read the second operational code;
extract the first repetition value from the first repetition field of the second encoded test vector in response to reading the second operational code; and
generate other test vectors in the first set of the test vectors with the memory data component in response to extracting the first repetition value, wherein each test vector in the first set of the test vectors includes test data that is a copy of the first test data and a number of the test vectors in the first set of the test vectors corresponds to the first repetition value.

* * * * *